United States Patent [19]

Schell

[11] Patent Number: 4,632,476

[45] Date of Patent: Dec. 30, 1986

[54] TERMINAL GROUNDING UNIT

[75] Inventor: Howard C. Schell, Westerville, Ohio

[73] Assignee: AT&T Bell Laboratories, Murray Hill, N.J.

[21] Appl. No.: 771,040

[22] Filed: Aug. 30, 1985

[51] Int. Cl.⁴ ............................................. H01R 13/52
[52] U.S. Cl. ................................ 339/14 R; 339/143 R
[58] Field of Search ............... 339/14 R, 17 L, 17 LC, 339/17 LM, 17 M, 143 R

[56] References Cited

U.S. PATENT DOCUMENTS

| | | | |
|---|---|---|---|
| 3,166,372 | 1/1965 | Just | 339/143 R X |
| 4,223,968 | 9/1980 | Kawabata et al. | 339/17 LC X |
| 4,571,014 | 2/1986 | Robin et al. | 339/14 R |

Primary Examiner—Eugene F. Desmond
Attorney, Agent, or Firm—Dwight A. Marshall

[57] ABSTRACT

A terminal grounding unit for use in interconnecting a plug-in circuit board with a backplane of equipment mounting apparatus. The terminal grounding unit comprises an insulating member having a row and column configuration of apertures intended for receiving pin terminals of the backplane to mount the insulating member on the backplane with the pin terminals extending outward therefrom to engage contact terminals of a connector mounted on the plug-in circuit board. Apparatus positioned in the insulating member between columns of the pin terminals slidably receives and interconnects a shield member of the plug-in circuit board connector with a backplane ground path.

12 Claims, 4 Drawing Figures

TERMINAL GROUNDING UNIT

TECHNICAL FIELD

This invention relates to connector grounding apparatus. In particular, it relates to a backplane of equipment mounting apparatus arranged for use in grounding high frequency connectors mounted on plug-in circuit boards installed in the equipment mounting apparatus.

BACKGROUND ART

Plug-in circuit boards having electronic components located thereon that are interconnected by printed wiring circuitry of the circuit board are widely used in the Telecommunication and Computer Industry. These types of circuit boards are oftentimes inserted in equipment mounting apparatus used to interconnect the circuit boards to form electronic systems such as telecommunication switching and computer systems. In general, the equipment mounting apparatus comprises frames having grooves located therein which receive edges of a circuit board and guide the circuit board to engage a backplane used to connect circuit boards together to form an electronic system.

The equipment mounting apparatus backplane may comprise an array of pin terminals mounted in the backplane to engage printed circuitry of the backplane or to extend outward from the back surface of the backplane to engage cable conductors used to interconnect the circuit boards. The pin terminals also extend outward from the front surface of the backplane to engage a pin insertion connector mounted on a circuit board so that an electrical conducting path may be established between the circuit board and the interconnecting backplane printed wiring circuitry and cabling so that the circuit board may be interconnected with other circuit boards to form the electronic system.

In the high speed technology of modern electronics high frequency connectors have been developed for use with circuit boards. Such a connector has been described in the co-pending application of M. S. Robin et al., Ser. No. 606,141, filed May 2, 1984, now U.S. Pat. No. 4,571,014, and is arranged to provide shielded paths between the connector contacts and printed wiring circuitry of the circuit board. A problem arises in the use of high frequency connectors mounted on plug-in circuit boards in that shielding members of the connector must be engaged with and disengaged from ground as a plug-in circuit board is inserted and removed from equipment mounting apparatus.

Accordingly, a need exists for apparatus for use in interconnecting high frequency connectors with ground of equipment mounting apparatus. A need also exists for apparatus arranged to interconnect and disconnect a high frequency connector mounted on a plug-in circuit board with ground as the circuit board is inserted and removed from equipment mounting apparatus.

SUMMARY OF THE INVENTION

The foregoing problems are solved and a technical advantage is achieved by a terminal grounding unit provided for use with a backplane of equipment mounting apparatus to interconnect contact terminals and shielding members of a connector with pin terminals and ground paths of the backplane.

In accordance with the invention, the terminal grounding unit comprises an insulating member for receiving pin terminals to mount the insulating member on the backplane of equipment mounting apparatus with the pin terminals extending outward therefrom to engage the contact terminals of a connector. Apparatus positioned in the insulating member between columns of the backplane pin terminals slidably receives and interconnects a connector shielding member with backplane ground paths to electrically shield the connector when the connector is engaged with the backplane.

Also in accordance with the invention, a terminal grounding unit for mounting on a backplane of circuit board mounting apparatus to interconnect contact terminals and a shielding member of a connector with pin terminals and ground paths of the backplane comprises a generally quadrilateral configured member formed of electrically insulating material. Apertures formed therein in a row and column configuration each have a conduit for accepting a first part of a backplane pin terminal in an interference fit and a cavity interconnected with the conduit for accepting a compliant portion of the backplane pin terminal projecting outward from a front surface of the backplane.

Also in accordance with the invention, a terminal grounding unit for use with a circuit board mounting apparatus backplane to interconnect a connector mounted on a plug-in circuit board with backplane pin terminals comprises an insulating member having a plurality of slots formed in a row configuration with each slot positioned between adjacent rows of backplane pin terminal receiving apertures. Ones of the slots are interconnected by channels formed in the insulating member between adjacent columns of the backplane pin terminal apertures to slidably receive a shield member of the plug-in circuit board connector so that the connector shield member may be connected with ground paths of the backplane.

In further accordance with the invention, a terminal grounding unit for use in interconnecting a plug-in circuit board mounting apparatus backplane having pin terminals and a ground path with a plug-in circuit board connector having contact terminals and a shielding member comprises U-shaped female contact terminals positioned in slots of an insulating member. Ones of the female contact terminals are coupled to electrically conducting members which are coupled with the backplane ground path so that a circuit board connector shielding member slidably inserted in channels interconnecting ones of the insulating member slots engages the female contact terminals to establish a connection with the backplane ground path.

DESCRIPTION OF THE DRAWING

The foregoing, as well as other objects, features and advantages of the invention will be more apparent from a description of the drawing in which.

DESCRIPTION OF THE INVENTION

1. Apparatus

Figure 1:
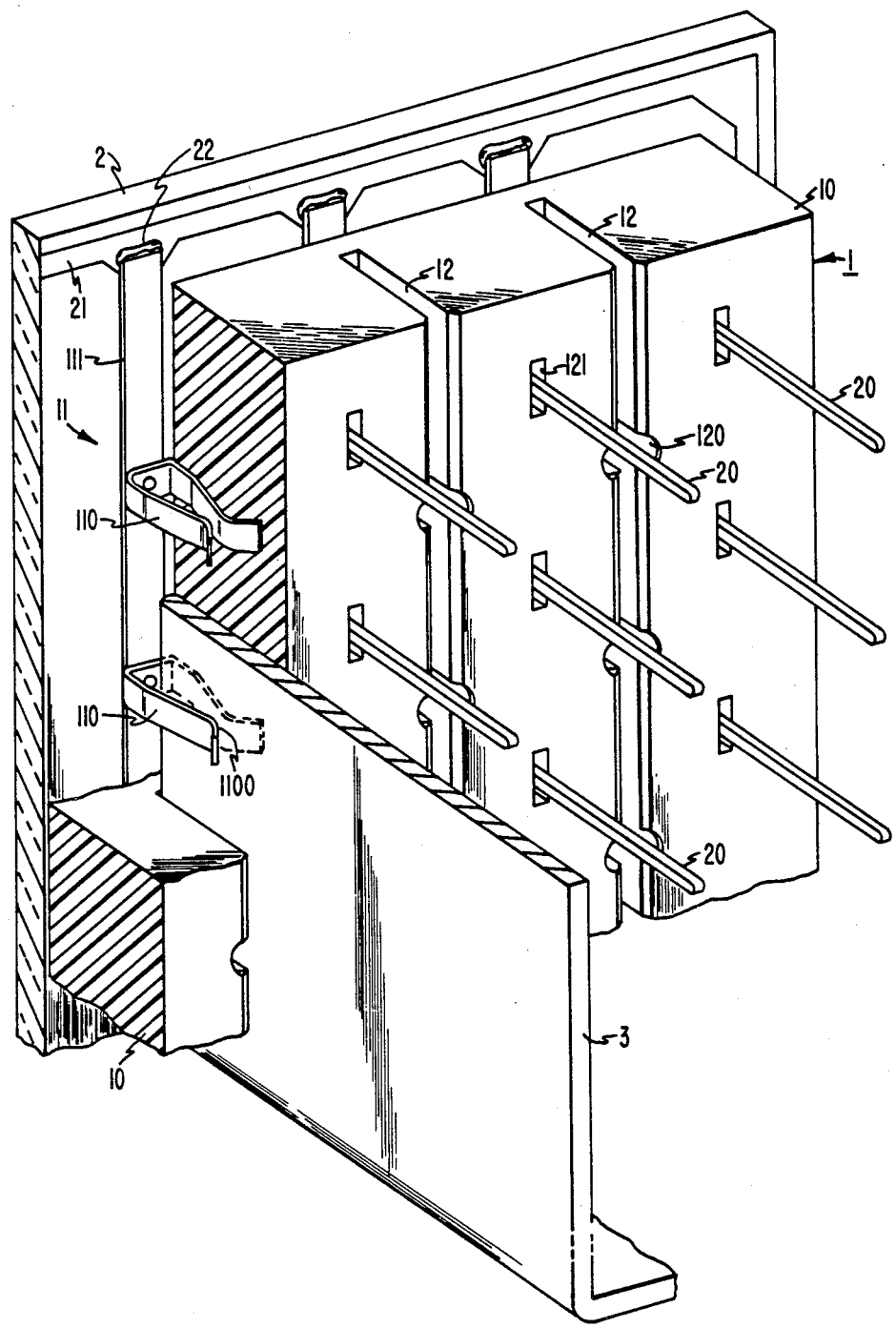
FIG. 1 sets forth a partial sectional view of the terminal ground unit apparatus embodying the principles of the instant invention.

Referring to the drawing and more specifically to FIG. 1 of the drawing, it is intended that terminal grounding unit 1 set forth therein be associated with equipment mounting apparatus backplane 2 and with a high frequency modulator plug-in circuit board of the type set forth in the aforementioned application by Robin et al. The present invention is not limited for use with the Robin modular high frequency connector but may also be advantageously utilized with other types of connectors as well.

It is intended that terminal grounding unit 1 be mounted on backplane 2 of equipment mounting apparatus and used for interconnecting a connector mounting on a plug-in circuit board which is inserted into the equipment mounting apparatus and engaged with backplane 2.

Equipment mounting apparatus is well known in the Electronic and Telecommunication Industry and need not be described for an understanding of the instant invention. Sufficient to say that equipment mounting apparatus oftentimes has a structure such as backplane 2 which is a part of the equipment mounting apparatus and is intended for use in interconnecting a number of plug-in circuit boards together. Backplane 2 may be a printed wiring type of circuit board wherein printed wiring circuitry located on either the back or front sides of backplane 2 is connected with a row and column configuration of terminals such as male pin terminals 20 used to connect plug-in circuit boards with the printed wiring of backplane 2. In another type of design backplane 2 may be used to mount pin terminals 20 that are wire-wrapped to cable conductors used to interconnect backplanes and frames of equipment mounting apparatus together to form an electronic system.

In the present embodiment of the invention each pin terminal 20 is assumed to be connected to a high frequency signal carrying conductor such as a center conductor of a coaxial cable. Modular connector apparatus, hereinafter referred to as a connector, is assumed to be mounted on a plug-in circuit board and interconnects the printed wiring circuitry of the circuit board by electrically shielded conductor paths with shielded contact terminals of the connector. The insertion of the circuit board into the equipment mounting apparatus engages a row and column configuration of shielded contact terminals of the connector with corresponding pin terminals 20 of backplane 2. Shielded connections are thereby established from pin terminals 20, through connector contact terminals and over electrically shielded conductor paths of the circuit board connector to the printed wiring circuitry of the circuit board.

Terminal grounding unit 1 is a generally quadrilateral configured member 10 formed of an electrical insulating material such as polybutylene terephthalate. A terminal grounding unit 1 may be configured such that several may be mounted on backplane 2 with each associated with ones of pin terminals 20 that are intended to engage the connector of a particular plug-in circuit board or such that an entire backplane 2 may be fitted with one terminal grounding unit 1. In addition, the equipment mounting apparatus may be retrofitted with a single or several terminal grounding units 1 to accept newer high frequency type of plug-in circuit boards.

An insulated member 10 has a row and column configuration of apertures 121 formed therein to receive backplane pin terminals 20 with each backplane pin terminal 20 extended perpendicularly outward from a surface thereof to engage a corresponding connector contact terminal. Each pin terminal aperture 121, FIG. 4, has a conduit 1210 formed to accept a first part of pin terminal 20 such that a shoulder 200, FIG. 2, maintains an interference fit of pin terminal 20 with side walls of aperture 121 to hold insulating member 10 against backplane 2. A cavity 1211, FIG. 4, interconnected with conduit 1210 is formed to accept a compliant section 201 of a pin terminal 20 which holds pin terminal 20 securely within a hole of backplane 2 and which projects above a front surface of backplane 2 so that terminal grounding unit 1 may be positioned flush against backplane 2.

Insulating member 10, FIG. 1, also has a plurality of slots 120 formed in row configurations with each slot 120 positioned midway between adjacent rows of pin terminal apertures 121. Ones of slots 120 each of which extend between opposing surfaces of insulating member 10 are interconnected by channels 12 formed on one of the surfaces of insulating member 10 midway between adjacent columns of pin terminal apertures 121 and are intended to slidably receive a contact terminal shielding member 3 of a plug-in circuit board connector.

Figure 2:
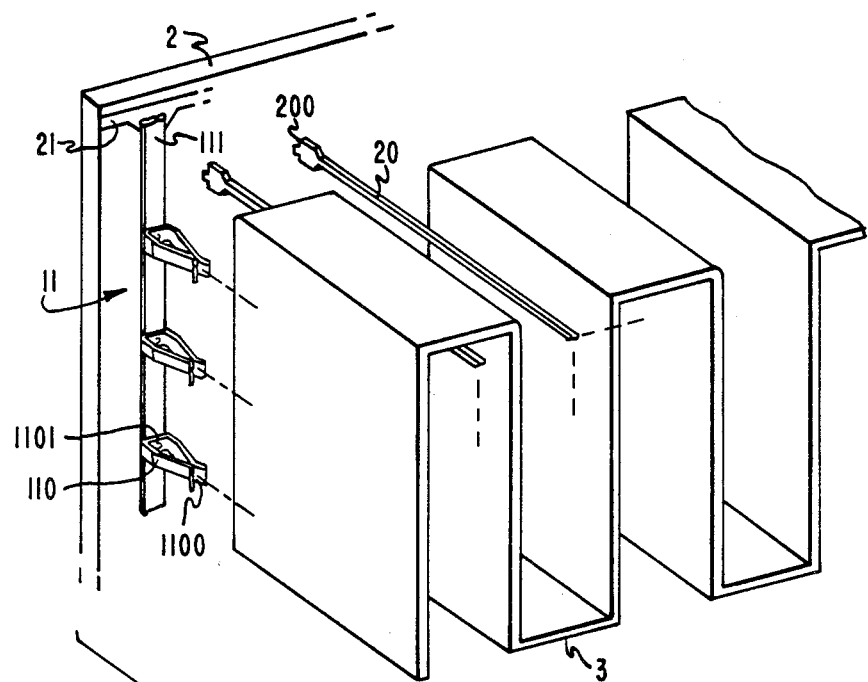
FIG. 2 illustrates the relationship of contact terminal apparatus of the terminal grounding unit set forth in FIG. 1 with backplane pin terminals and a circuit board connector shield member.

Referring now to FIG. 2 of the drawing, terminal grounding unit 1 also has a plurality of contact assemblies 11 each intended to engage and interconnect connector shield member 3 with ground paths 21 of backplane 2. A contact assembly 11 includes a number of generally U-shaped female contacts 110 each having contact surfaces 1100 located on the inside of the ends of the arms for engaging connector shielding member 3. Each U-shaped female contact 110 may be a part of or is affixed at the closed end thereof, for example by welding, to an electrical conducting member 111 intended for use in interconnecting female contacts 110 with ground paths 21 of background 2.

2. Assembly

Figure 4:
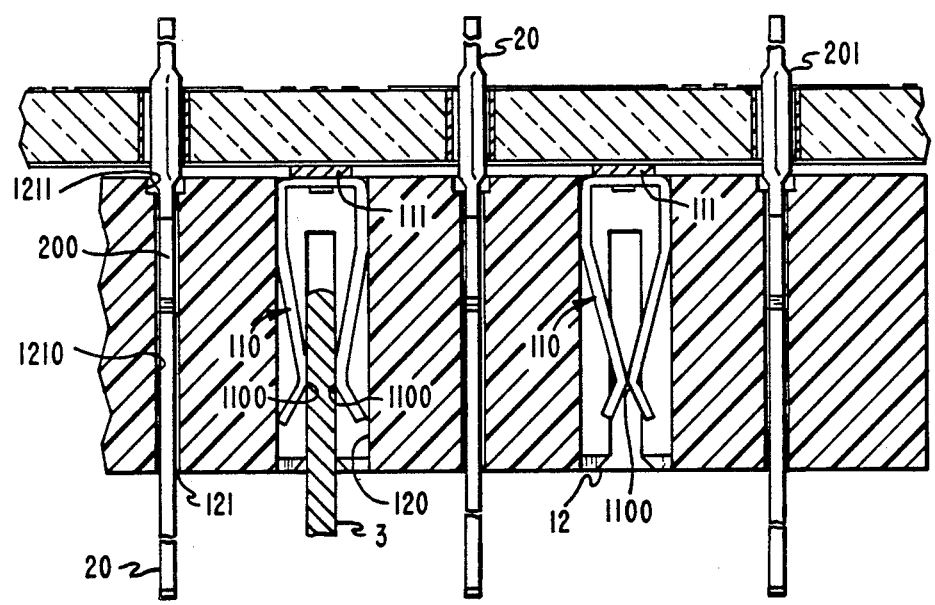
FIG. 4 illustrates a sectional view of the terminal grounding unit apparatus set forth in FIG. 1 taken along the broken line 4—4 of FIG. 3.

Referring now to FIG. 1 of the drawing, terminal grounding unit 1 is assembled by taking each of the contact assemblies 11 and positioning each U-shaped female contact 110 in a corresponding slot 120, as set forth in FIG. 4. Each U-shaped female contact 110 is positioned within slot 120 such that electrical conducting members 111 are positioned flush against a back surface of insulating member 10 and the open arms of each female contact 110 face a channel 12 such that a connector shielding member 3 slidably inserted in channel 12 engages female contact conducting surfaces 1100. Insulating member 10 with contact assemblies 11 positioned therein is positioned against backplane 2 such that each aperture cavity 1211 of an aperture 121 is aligned with a corresponding pin terminal 20. Pressure is inserted on insulating member 10 to press insulated member 10 against backplane 2 such that shoulder 200 of each pin terminal 20 is received with aperture conduit 1210 in an interference fit to maintain insulating member 10 against backplane 2 with the ends of pin terminals 20 extending perpendicularly outward from a surface of insulating member 10. Subsequently, each electrical conducting member 111, FIG. 1, is coupled by soldering or welding or any one of a number of well known methods to backplane ground paths 21.

Figure 3:
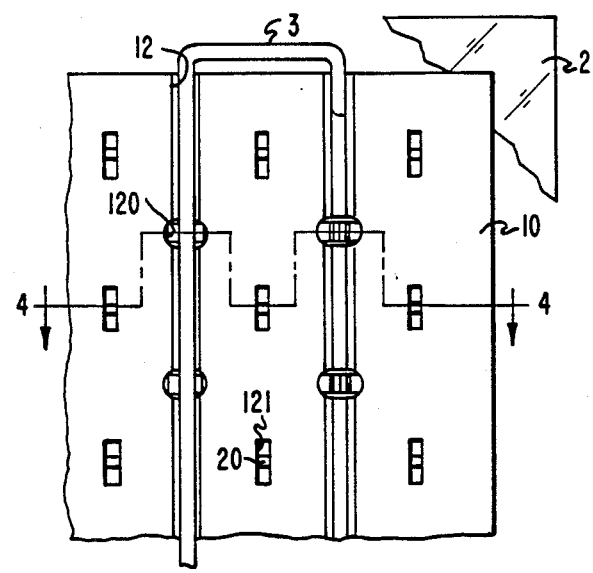
FIG. 3 is a view of the front surface of the terminal grounding unit apparatus set forth in FIG. 1 showing the relationship of circuit board connector shielding member receiving channels and contact terminal slots with backplane pin terminal apertures.

The insertion of a plug-in circuit board into the equipment mounting apparatus aligns a connector mounted on the circuit board with pin terminals 20 of backplane 2. As the circuit board is further inserted into the equipment mounting apparatus, pin terminals 20 engage the connector contact terminals and connector shield member 3 is inserted in channels 12 of terminal grounding unit 1 to engage female contacts 110. Electrical connections are established between circuitry of the circuit board and backplane 2 through the connector contact terminals and pin terminals 20. The connector shielding member 3 is interconnected with backplane ground path 21 through female contacts 110 and electrically conducting member 111. The resultant grounding of connector shield member 3 shields each of the electrical connections through the circuit board connector and also shields ones of pin terminals 20, FIG. 3, extending through insulating member 10. Terminal grounding unit 1, in addition to enabling the circuit board connector to be connected to ground, also enables the plug-in circuit board to be easily disconnected from ground by simply pulling the plug-in circuit board from the equipment mounting apparatus.

SUMMARY

It is obvious from the foregoing that the facility, economy and efficiency of equipment mounting apparatus may be substantially enhanced by the use of a terminal grounding unit for interconnecting high frequency connector with a ground path of a backplane of the equipment mounting apparatus. It is further obvious that apparatus arranged for mounting on a backplane of equipment mounting apparatus to interconnect and disconnect a high frequency connector mounted on a plug-in circuit with ground as the circuit board is inserted and removed from the equipment mounting apparatus facilitates the use and update of existing equipment mounting apparatus with high speed circuitry of modern plug-in circuit boards.

While the terminal grounding unit of the instant invention has been disclosed with an insulating member having contact terminals and channels arranged in a vertical configuration, it is to be understood that the contact terminals and channels could be arranged in a horizontal configuration without departing from the spirit and scope of the invention.

What is claimed is:

1. Apparatus for use with a backplane of equipment mounting apparatus to interconnect contact terminals and a shielding member of a connector with pin terminals and ground paths of the backplane comprising
    insulating means for receiving the pin terminals to mount said insulating means on the backplane with the pin terminals extending outward therefrom to engage the connector contact terminals, and
    means positioned in said insulating means between columns of the pin terminals for slidably receiving and interconnecting the connector shielding member with the backplane ground paths to shield the connector engaged with the backplane.

2. The apparatus set forth in claim 1 wherein said insulating means comprises
    a generally quadrilateral configured member formed of insulating material and having a plurality of apertures formed in a row and column configuration each for receiving one of the backplane pin terminals.

3. The apparatus set forth in claim 2 wherein said slidably receiving and interconnecting means comprises
    a plurality of channels formed in a column configuration on one surface of said insulating member with each channel positioned between adjacent columns of said apertures for slidably receiving the connector shielding member.

4. The apparatus set forth in claim 3 wherein said slidably receiving and interconnecting means comprises
    terminal means positioned in insulating member channels at locations between adjacent rows of said insulating member apertures for engaging the connector shield member.

5. The apparatus set forth in claim 4 wherein said slidably receiving and interconnecting means comprises
    conducting means electrically coupled with said terminal means and the backplane ground path for electrically grounding the connector shielding member.

6. Apparatus for use with a backplane of equipment mounting apparatus to interconnect contact terminals and a shielding member of a connector with pin terminals and ground paths of the backplane comprising
    insulating means for receiving the backplane pin terminals in an interference fit to mount said insulating means on the backplane juxtaposed between the backplane and connector with the pin terminals extending perpendicularly outward from a surface thereof to engage the connector contact terminals, and
    means positioned in said insulating means between rows and columns of the pin terminals for slidably receiving and interconnecting the connector shielding member with the backplane ground paths to shield ones of the backplane pin terminals and the connector engaged with the backplane.

7. The apparatus set forth in claim 6 wherein said insulating means comprises
    a generally quadrilateral configured member formed of electrically insulating material and having a plurality of apertures formed in a row and column configuration with each of said apertures having a conduit for accepting a first part of each backplane pin terminal in said interference fit and a cavity interconnected with said conduit for accepting a compliant portion of each backplane pin terminal projecting above a front surface of the backplane.

8. The apparatus set forth in claim 7 wherein said slidably receiving and interconnecting means comprises
    a plurality of slots formed in said insulating member in a row configuration with each slot positioned between adjacent rows of said backplane pin terminal apertures and ones of the slots interconnected by channels formed between adjacent columns of the backplane pin terminal apertures for slidably receiving the connector shielding member.

9. The apparatus set forth in claim 8 wherein said slidably receiving and interconnecting means comprises
    a plurality of generally U-shaped contact terminals each positioned in one of said slots with contact surfaces thereof located with respect to said channel interconnecting ones of the slots for slidably engaging the connector shielding member.

10. The apparatus set forth in claim 9 wherein said slidably receiving and interconnecting means comprises
    conducting members each coupled with ones of said U-shaped contact terminals positioned in ones of said columns of slots and with the backplane ground paths for electrically grounding the connector shielding member.

11. A terminal grounding unit for use with a backplane of circuit board mounting apparatus to interconnect contact terminals and a shielding member of a plug-in circuit board connector with pin terminals and a ground path of the backplane comprising a generally quadrilateral configured member formed of electrically insulating material and having a plurality of apertures formed therein in a row and column configuration with each of said apertures formed for receiving the backplane pin terminals in an interference fit to mount said insulating member on the backplane juxtaposed between the backplane and plug-in circuit board connector with the pin terminals extending perpendicularly outward from a surface thereof to engage the plug-in circuit board connector contact terminals, a plurality of slots formed in said insulating member in a row configuration with each slot positioned between adjacent rows of said backplane pin terminal apertures and with ones of slots interconnected by channels each formed between adjacent columns of said backplane pin terminal apertures for slidably receiving the circuit board connector shielding member, a plurality of generally U-shaped female contact terminals each positioned in one of said slots with contact surfaces thereof located for engaging the circuit board connector shielding member slidably inserted in said channel, and electrically conducting means coupled with said U-shaped female contact terminals and with the backplane ground path for electrically grounding the circuit board connector shielding member and shielding ones of the backplane pin terminals.

12. A terminal grounding unit for use in interconnecting a plug-in circuit board mounting apparatus backplane having pin terminals and a ground path with a plug-in circuit board connector having contact terminals and shielding members characterized in that said terminal grounding unit comprises an insulating member having a row and column configuration of apertures formed therein for receiving the backplane pin terminals with the backplane pin terminals extending outward therefrom to engage the plug-in circuit board connector contact terminals and having a row configuration of slots positioned between adjacent rows of said backplane pin terminal apertures with ones of said slots interconnected by channels each formed between adjacent columns of said backplane pin terminal apertures for slidably receiving the circuit board connector shielding member, and electrically connecting means positioned in said insulating member slots and coupled with the backplane ground path for slidably receiving and interconnecting the plug-in circuit board connector shielding members inserted into said insulating member channels with the backplane ground path.

* * * * *